United States Patent [19]

Magerl

[11] 4,222,038
[45] Sep. 9, 1980

[54] MICROCOMPUTER KEYBOARD INPUT CIRCUITRY

[75] Inventor: Richard A. Magerl, Schaumburg, Ill.

[73] Assignee: Motorola, Inc., Schaumburg, Ill.

[21] Appl. No.: 881,090

[22] Filed: Feb. 24, 1978

[51] Int. Cl.³ .............................................. G06F 3/02
[52] U.S. Cl. ................................ 340/365 S; 364/200
[58] Field of Search ............ 340/365 R, 365 S, 365 E; 365/240; 178/17 C; 179/90 K; 364/705, 706, 709, 710, 200 MS File, 900 MS File; 400/479, 472

[56] References Cited

U.S. PATENT DOCUMENTS

| | | | |
|---|---|---|---|
| 3,483,553 | 12/1969 | Blankenbaker | 340/365 S |
| 3,750,113 | 7/1973 | Cencel | 340/365 S |
| 3,921,166 | 11/1975 | Volpe | 340/365 S |
| 3,949,365 | 4/1976 | Kashio | 340/365 S |
| 3,955,460 | 5/1976 | Southard | 340/365 S |
| 3,973,256 | 8/1976 | Stoesser et al. | 340/365 S |
| 3,979,730 | 9/1976 | Bennett et al. | 364/200 |
| 4,020,391 | 4/1977 | Baxter | 340/365 S |
| 4,020,467 | 4/1977 | Hashimoto et al. | 340/365 S |
| 4,030,079 | 6/1977 | Bennett et al. | 364/200 |
| 4,106,011 | 8/1978 | Melanson et al. | 340/365 S |

Primary Examiner—John W. Caldwell, Sr.
Assistant Examiner—James J. Groody
Attorney, Agent, or Firm—Rolland R. Hackbart; James W. Gillman

[57] ABSTRACT

Keyboard input circuitry for use in a microcomputer continuously scans a keyboard having a plurality of keys organized into K columns and J rows. A counter under control of a reset signal and clock signal, sequentially provides K output signals for enabling the K column conductors. When a key in the Kth column and Jth row is depressed, the Kth output signal from the counter will be coupled to the Jth row. Thus, the logical state of the J row conductors will determine whether or not a key of the enabled column of keys is depressed or not. The microcomputer includes a register, a memory, and a peripheral interface adapter circuit. The microcomputer provides the reset signal and clock signal to the register and to the counter by way of the peripheral interface adapter circuit, for maintaining synchronism between the register and counter. For each enabled column of keys, the microcomputer senses the logical states of the J row conductors via the peripheral interface adapter circuit, and then ascertains whether or not a particular key is depressed by the sensed logical state of its row conductor and the state of the register.

5 Claims, 4 Drawing Figures

MICROCOMPUTER KEYBOARD INPUT CIRCUITRY

RELATED APPLICATIONS

This application is related to the instant assignees co-pending U.S. Application, Ser. No. 837,255, entitled "Mobile Data Terminal", by James A. Lamb, et al and filed on Sept. 27, 1977.

BACKGROUND OF THE INVENTION

1. Field of the Invention

This invention relates to keyboard input circuitry, and more particularly, to improved keyboard circuitry for use in data processing systems.

2. Description of the Prior Art

Keyboards having a matrix of keys are particularly well suited for use in data processing systems. The keys of such keyboards provide continuity between corresponding column and row conductors when depressed. Output signals from the data processing system are coupled to each column conductor for sequentially scanning the keyboard for depressed keys. A depressed key is sensed when the output signal from the column conductor is present on the corresponding row conductor. Thus, for a matrix of keys having K columns and J rows, the data processing system must provide K output signals for the K columns and monitor the J row conductors. As a result, a relatively large number of signals (K+J) are required to interface the data processing system to the keyboard.

In order to reduce the number of interconnecting signals, additional circuitry may be utilized for scanning the matrix of keys and providing a digitally coded signal when a particular key is depressed. The digitally coded signal uniquely identifies the depressed key. However, the stored program control of the data processing system must be programmed to decode the digitally coded signals in order to recognize the depressed key, and the additional circuitry increases the cost of the data processing system.

For the foregoing and other shortcomings and problems, there has been a long felt need for an improved keyboard input circuitry for use for the data processing system.

SUMMARY OF THE INVENTION

Accordingly, it is a general object of the present invention to provide an improved and inexpensive keyboard input circuitry for use in a data processing system.

It is a further object of the present invention to provide an improved keyboard input circuitry that minimizes the interconnections between the keyboard circuitry and the data processing system.

It is a still further object of the present invention to provide a keyboard input circuitry that may be efficiently scanned by the data processing system under stored program control.

Accordingly, keyboard input circuitry for a data processing system is provided that comprises keyboard circuitry including a keyboard and counting circuitry and data processing circuitry including interface circuitry, a register and processing circuitry. The keyboard includes a matrix of keys organized into K columns and J rows, where J and K are integer numbers greater than one. Each key has a contact coupled to a Kth column conductor and a contact coupled to a Jth row conductor. When a key is depressed, continuity is provided between the corresponding Kth column conductor and Jth row conductor.

The counting circuitry is coupled to the keyboard and is adapted to provide in response to a clock signal K output signals for sequentially enabling the K column conductors of the keyboard. The counting circuitry is further responsive to a reset signal for providing a predetermined one of its K output signals.

The data processing circuitry includes a register, processing circuitry and interface circuitry for interfacing the keyboard circuitry to the processing circuitry. The interface circuitry couples to clock signal and the reset signal to the counting circuitry, and also is coupled to the J row conductors of the keyboard for sensing the states thereon. The states of the row conductors are indicative of the depressed and nondepressed keys of the respective enabled column of keyboard, where a sensed predetermined first state may indicate depressed keys and a sensed predetermined second state may indicate nondepressed keys. For example, depressed keys may be indicated by a logical one state and nondepressed keys by a logical zero state.

The register is adapted to sequentially provide in response to the clock signal N output signals, which correspond to the K output signals of the counting circuitry. The register is further responsive to the rest signal for providing a predetermined one of its N output signals for synchronizing the register and the counting circuitry to the same initial output signal. Thus, the register and the counting circuitry are synchronized to one another such that they are both providing the same output signal at all times. As a result, N and K have the same value at all times.

The processing circuitry is coupled to the interface means and register means for providing both the reset signal to synchronize the output signals of the register and the counting circuitry and the clock signal to synchronously sequence the output signals of the register and the counting circuitry. The processing circuitry is further responsive to the sensed states of the keys from the respective enabled column of keys for identifying a depressed key by the sensed predetermined state of the Jth row conductor and the Kth output signal of the register. Thus, each depressed key may be uniquely identified without coupling the output signals of the counting circuitry to the processing circuitry since the output signals of the register are synchronized to the output signals of the counting circuitry.

Additional features, objects and advantages of the keyboard input circuitry in accordance with the present invention will be more clearly apprehended from the following detailed description together with the accompanying drawings.

DETAILED DESCRIPTION OF THE PREFERRED EMBODIMENT

Figure 1:
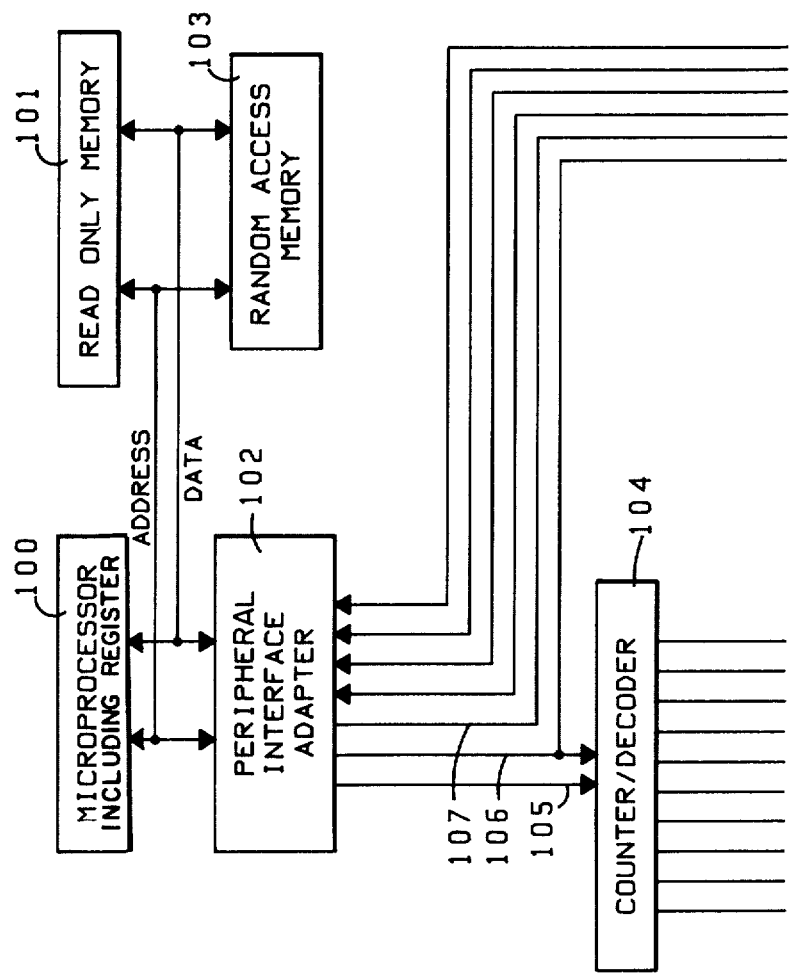
FIGS. 1 and 2 when arranged in accordance with FIG. 4 illustrate a functional block diagram of the data processing system and keyboard input circuitry in accordance with the present invention.
Figure 2:
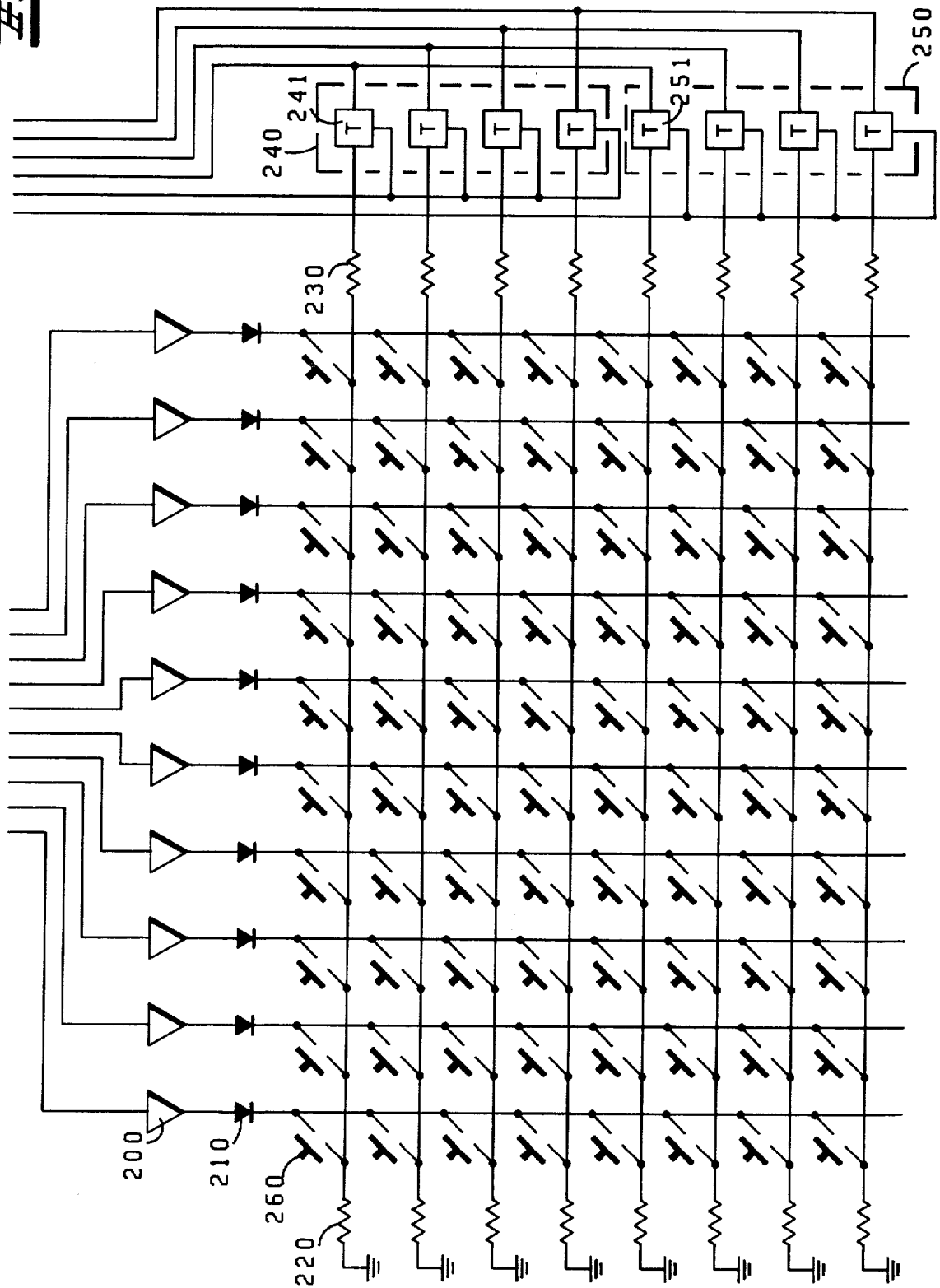

Referring to the functional block diagram of FIGS. 1 and 2 when arranged in accordance with FIG. 4, a microcomputer system with a keyboard input circuitry in accordance with the present invention is shown. The microcomputer includes a microprocessor 100, a read only memory 101 and a random access memory 103. The keyboard input circuitry includes a peripheral interface adaptor circuit 102, a counter/decoder 104, buffer circuits 200, and a matrix of keys 260 together with diodes 210, resistors 220 and 230 and transmission circuits 240 and 250.

The microcomputer 100 can be any of a number of commercially available microcomputers such as the Motorola M6800 system. For example, the microprocessor 100 may be a Motorola MC6800, the read only memory 101 may be a Motorola MCM6830 and the random access memory 103 may be a Motorola MCM6810. Operation of the Motorola M6800 microcomputer system is described in "M6800 Microcomputer System Design Data", by Motorola, Inc., 1976 and in U.S. Pat. No. 4,030,079 entitled "Processor Including Incrementor and Program Register Structure" by Thomas H. Bennett et al, issued on June 14, 1977 and assigned to the instant assignee.

The peripheral interface adapter circuit 102 interfaces the keyboard input circuitry to the microcomputer system. The peripheral interface adapter circuit 102 may be a Motorola MC6820 which is described in U.S. Pat. No. 3,979,730 entitled "Interface Adapter Having Control Register", by Thomas H. Bennett et al, issued on Sept. 7, 1976 and assigned to the instant assignee.

The peripheral interface adapter circuit 102 controls the counter/decoder 104 by means of a reset signal 105 and a clock signal 106. At the beginning of each scan of the keyboard, the reset signal 105 is toggled to reset the counter/decoder 104 to its initial state. Then, transitions of the clock signal 106 advance the counter/decoder 104 from state to state for scanning the successive columns of the keyboard.

The states of the counter/decoder 104 are decoded to provide 10 output signals which are coupled to buffer gates 200. The output of the buffer gates 200 are coupled to diodes 210 for application to the column conductors of the keyboard. Each column conductor is coupled to one contact of the keys 260 in its respective column. The other contact of the keys 260 is coupled to a corresponding row conductor which is terminated by a resistor 220 to ground and coupled through resistors 230 to corresponding transmission circuits 240 and 250. When a key 260 is depressed, continuity is provided between the corresponding column conductor and row conductor. In the preferred embodiment of the present invention the keyboard is a matrix having 10 columns and 8 rows and providing for up to 80 keys 260.

The transmission circuits 240 and 250 each include four individual transmission gates 241 and 251. The outputs of the transmission gates 241 and 251 are coupled together and multiplexed by the clock signal 106 and the select signal 107. Thus the eight row conductors are multiplexed by the transmission circuits 240 and 250 onto four lines coupled to the peripheral interface adapter circuit 102. During a scan of the keyboard, a particular column signal is applied, and the first four and last four row conductors are examined by first enabling transmission circuit 240 and then enabling transmission circuit 250.

Figure 3:
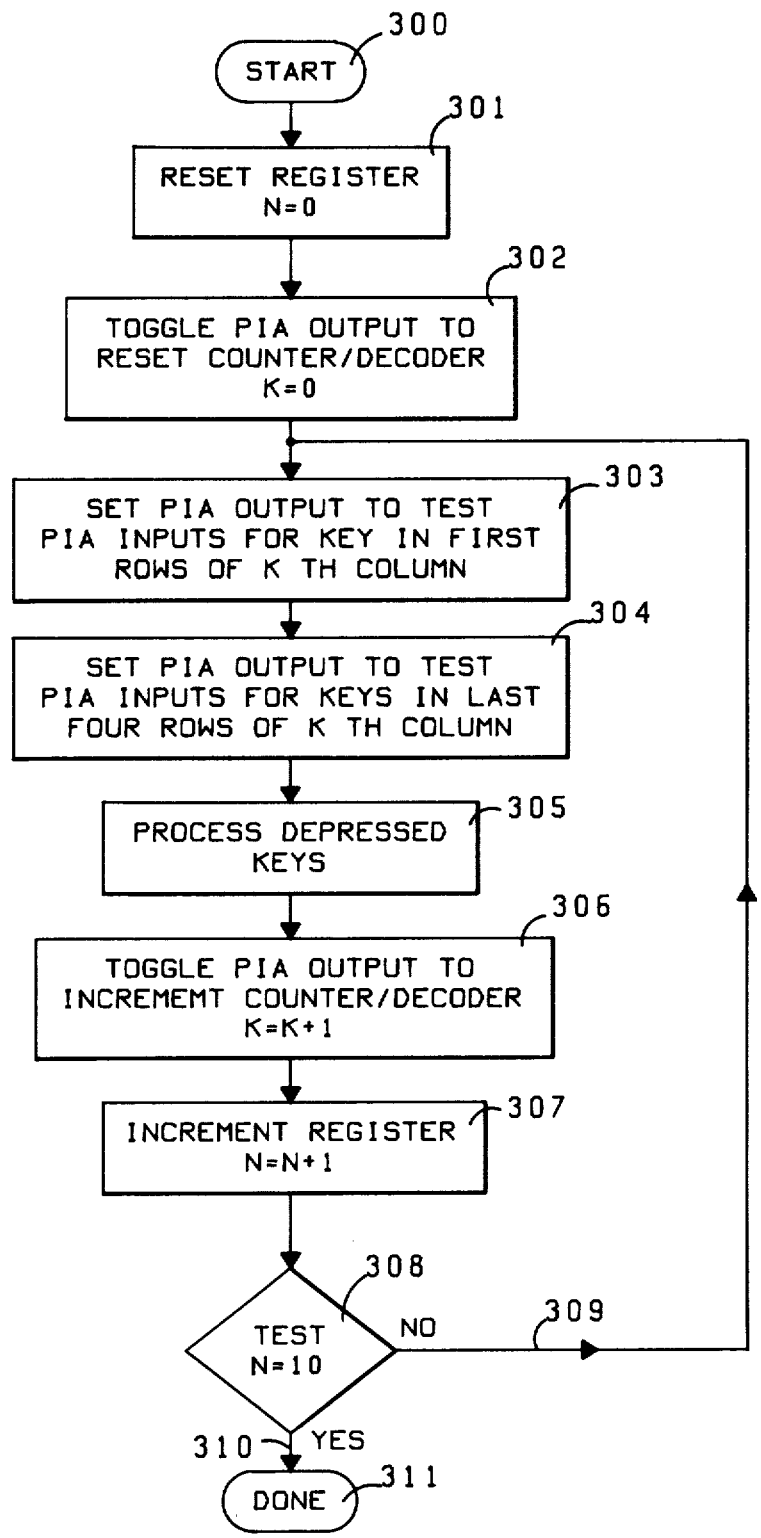
FIG. 3 is a flow chart of the stored program control for the keyboard input circuitry.

The scanning of the keyboard can be more clearly understood by referring to the flow chart of FIG. 3. The stored program of the microcomputer system utilizes an internal register of the microprocessor 100 that is synchronized to the counter/decoder 104 in order to determine the particular column that is being scanned. By using an internal register, the microprocessor 100 need not provide the ten output signals to scan the column conductors of the keyboard.

The flow chart begins at START block 300 and proceeds to block 301 where the internal register is reset; resulting in N=0. Next at block 302, the PIA output, the reset signal 105, is toggled to reset the counter/decoder 104; resulting in K=0.

Proceeding to block 303, the PIA inputs for the keys in the first four rows of the Kth column are tested to detect depressed keys. Next, at block 304 the PIA output, the select signal 107, is set to multiplex the keys in the last four rows of the Kth column to the PIA. These keys are likewise tested to detect depressed keys. Next, at block 305 the depressed keys are processed. The particular key is identified by using N from the internal register and the particular bit from the PIA indicating a depressed key. For example, a depressed key may be identified by a logical one state of the particular bit from the PIA.

Proceeding to block 306, the PIA output, the clock signal 106, is toggled to increment the counter/decoder 104, resulting in K=K+1, in order to scan the next row of the keyboard. Next, at block 307 the internal register is incremented, resulting in N=N+1, in order to maintain correspondence between N and K of the counter/decoder 104.

Proceeding to decision block 308, the state of N is tested to see if the ten columns have been scanned. If N=10, YES branch 310 is taken to DONE block 311. Otherwise, NO branch 309 is taken to return to block 303 to sample the keys in the next column.

The flowchart of FIG. 3 may be readily programmed by one skilled in the art for use in the microcomputer system. Programming techniques for the M6800 microcomputer system are described in "M6800 Programming Reference Manual" by Motorola, Inc., 1976. The use of the relatively simple flowchart of FIG. 3 enables one to eliminate a highly complex and expensive keyboard input circuitry that would otherwise be required. Also the keyboard may be organized to have any suitable number of columns and rows for the particular application.

The foregoing embodiments have been intended as illustrations of the principles of the present invention. Accordingly, other modifications, uses and embodiments can be devised by those skilled in the art without departing from the spirit and scope of the principles of the present invention.

What is claimed is:

1. Keyboard input circuitry for a data processing system, comprising:
    (a) keyboard circuitry including:
        (i) keyboard means having a plurality of keys organized into K columns and J rows, where K and J are integer numbers greater than one, each key having a contact coupled to a corresponding Kth column conductor and a contact coupled to a corresponding Jth row conductor and providing continuity between the corresponding Kth column and Jth row conductor when depressed; and
        (ii) counting means coupled to the keyboard means and adapted to sequentially provide in response to a clock signal K output signals for sequentially enabling the K column conductors of the keyboard means, said counting means further being responsive to a reset signal for providing a predetermined one of its K output signals; and (b) data processing circuitry including:
(i) interface means for coupling the clock signal and the reset signal to the counting means, said interface means further being coupled to the J row conductors for sensing the states thereon indicative of the depressed and nondepressed keys of the respective enabled column, where a sensed predetermined first state indicates depressed keys and a sensed predetermined second state indicates nondepressed keys;
(ii) register means adapted to sequentially provide in response to the clock signal K output signals corresponding to the K output signals of the counting means, said register means further being responsive to the reset signal for providing a predetermined one of its K output signals corresponding to said predetermined one of the counting means output signals; and
(iii) processing means coupled to the interface means and register means for providing the reset signal to synchronize the output signals of the counting means and register means and providing the clock signal to synchronously sequence the output signals of the counting means and register means, and the processing means further being responsive to the sensed states of the keys from the respective enabled column of keys for identifying a depressed key by the sensed predetermined first state of the Jth row conductor and by the Kth output signal from the register means.

2. The keyboard input circuitry according to claim 1, wherein said processing means is a microcomputer and said interface means is a peripheral interface adapter circuit.

3. The keyboard input circuitry according to claim 2, wherein said counting means is a counter providing K states and a decoder coupled to the counter for decoding the K states to provide the K output signals.

4. The keyboard input circuitry according to claim 3, further including second keyboard means having a plurality of keys coupled to K column conductors and J row conductors and a multiplexer for coupling the first and second keyboard means to the peripheral interface adapter circuit, the peripheral interface adapter circuit responsive to the microcomputer for providing a keyboard select signal that enables the multiplexer to select between the first and second keyboard means.

5. Keyboard input circuitry for a microcomputer system, comprising:
(a) keyboard circuitry including:
(i) a first keyboard having a plurality of keys organized into K columns and J rows, where K and J are integer numbers greater than one, each key of the first keyboard having a contact coupled to a corresponding Kth column conductor and a contact coupled to a corresponding Jth row conductor and providing continuity between the corresponding Kth column conductor and Jth row conductor when depressed;
(ii) a second keyboard having a plurality of keys organized into K columns and J rows, where K and J are integer numbers greater than one, each key of the second keyboard having a contact coupled to a corresponding Kth column conductor and a contact coupled to a corresponding Jth row conductor and providing continuity between the corresponding Kth column conductor and Jth row conductor when depressed;
(iii) a counter for sequentially providing in response to a clock signal, K states, said counter further being responsive to a reset signal for providing a predetermined one of its K states;
(iv) a decoder for decoding the K states of the counter to provide K output signals for enabling the K column conductors of both the first and second keyboards; and
(v) a multiplexer for selecting the J row conductors of the first keyboard in response to a predetermined first state of a select signal and selecting the J row conductors of the second keyboard in response to a predetermined second state of the select signal; and (b) a microcomputer including:
(i) a peripheral interface adapter (PIA) circuit for coupling the clock signal and reset signal to the counter and coupling the select signal to the multiplexer, said PIA circuit further being coupled to the multiplexer for sensing the states of the keys of the respective enabled column of the selected first and second keyboards, where a sensed predetermined first state indicates depressed keys and a sensed predetermined second state indicates nondepressed keys;
(ii) a memory for storing a program; and
(iii) a microprocessor including a register for sequentially providing in response to the clock signal K states corresponding to the K states of the counter, said register responsive to the reset signal for providing a predetermined one of its K states corresponding to said predetermined one of the counter's K states; the microprocessor being responsive to the program read from the memory for providing the reset signal to synchronize the counter and register, the clock signal to synchronously sequence the states of the counter and register, and the select signal with a predetermined first state to select the first keyboard and a predetermined second state to select the second keyboard, and the microprocessor further being responsive to the sensed states of the keys from the respective enabled column of keys for identifying a depressed key by the sensed predetermined state of the Jth row conductor, the Kth state from the register, and the state of the select signal.

* * * * *

UNITED STATES PATENT AND TRADEMARK OFFICE
CERTIFICATE OF CORRECTION

PATENT NO. : 4,222,038

DATED : September 9, 1980

INVENTOR(S) : Richard A. Magerl

It is certified that error appears in the above—identified patent and that said Letters Patent is hereby corrected as shown below:

Col. 2, line 27, "rest" should be -- reset --.

Col. 4, lines 62-63, insert -- conductor -- after "column".

Signed and Sealed this

Twenty-third Day of December 1980

[SEAL]

Attest:

SIDNEY A. DIAMOND

Attesting Officer

Commissioner of Patents and Trademarks